US006614120B2

(12) United States Patent
Sato et al.

(10) Patent No.: US 6,614,120 B2
(45) Date of Patent: Sep. 2, 2003

(54) SEMICONDUCTOR DEVICE

(75) Inventors: Hisakatsu Sato, Suwa (JP); Tomoo Takaso, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/209,313

(22) Filed: Jul. 31, 2002

(65) Prior Publication Data

US 2003/0034567 A1 Feb. 20, 2003

(30) Foreign Application Priority Data

Aug. 1, 2001 (JP) ........................................ 2001-233745

(51) Int. Cl.$^7$ ........................... H01L 23/52; H01L 23/48
(52) U.S. Cl. ........................ 257/758; 257/208; 257/211; 257/620; 257/773
(58) Field of Search ............................. 257/700, 701, 257/758, 211, 207, 208, 786, 774, 620, 621, 797, 784, 773

(56) References Cited

U.S. PATENT DOCUMENTS 5,117,280 A * 5/1992 Adachi ..................... 257/669
2002/0022399 A1 * 2/2002 Ninomiya .................. 439/500

FOREIGN PATENT DOCUMENTS

JP          05226339 A  *  9/1993  ....... H01L/21/3205

* cited by examiner

*Primary Examiner*—Nathan J. Flynn
*Assistant Examiner*—Pershelle Greene
(74) *Attorney, Agent, or Firm*—Harness, Dickey & Pierce, P.L.C.

(57) ABSTRACT

A semiconductor device 1000 in accordance with the present invention has a structure having multiple wiring layers, and includes a bonding pad 40*a*, dummy wiring forming regions 35 including dummy wirings 30, and dummy wiring prohibiting regions 15 where dummy wirings are not formed. The dummy wiring prohibiting regions 15 are provided at least below a region where the bonding pad 40*a* is formed.

13 Claims, 8 Drawing Sheets

PRIOR ART

SEMICONDUCTOR DEVICE

BACKGROUND OF THE INVENTION

1. Technical Filed of the Invention

The present invention relates to semiconductor devices with a structure having multiple wiring layers, and more particularly to semiconductor devices with a structure having multiple wiring layers including dummy wirings.

2. Background Technology

At present, wiring layers are formed in multiple layers in semiconductor devices in order to achieve a higher integration and further miniaturization. An interlayer dielectric layer is formed between one wiring layer and another wiring layer formed above that wiring layer. The interlayer dielectric layer is planarized by a chemical mechanical polishing method (CMP method).

A technique has been proposed to improve the flatness of the interlayer dielectric layer. According to this technique, as shown in FIGS. 7 and 8, dummy wirings 130 are formed between densely formed wiring layers 170 and an isolated wiring layer 171 in the same wiring layer level and in the same steps to form these wiring layers. FIG. 7 shows a plan view of a semiconductor device having a structure with multiple wiring layers, and FIG. 8 schematically shows a cross section taken along a line B—B in the semiconductor device shown in FIG. 7. FIG. 7 shows a plan view of the device when it is cut along a plane including the bonding pad 14 and in parallel with a surface of a silicon substrate 111 shown in FIG. 8. As indicated in FIGS. 7 and 8, the dummy wirings 130 thus formed can prevent interlayer dielectric layers 110a–110f from creating step differences between them.

Bonding pads are normally formed to electrically connect external electrodes of the semiconductor device and elements within the semiconductor device. For example, in the semiconductor device shown in FIGS. 7 and 8, a bonding pad 140 is formed in a layer at the same level as that of the dummy wirings 130 that are formed in the uppermost layer. The bonding pad 140 is connected to an electrode (not shown) outside the semiconductor device through, for example, a bump electrode (not shown). Furthermore, as shown in FIG. 8, dummy wirings 150 are also formed in layers at levels lower than that of the dummy wirings 130 and the bonding pad 140 in order to improve the flatness of the interlayer dielectric layers. For example, Japanese laid-open patent application HEI 10-335333 describes a semiconductor device having such a structure.

However, when the semiconductor device includes the dummy wirings 150 that are formed in a region immediately below the bonding pad 140, the following problems may occur when the bonding pad 140 and an electrode outside of the semiconductor device are to be electrically connected through a bump electrode.

Due to a pressure applied to the surface of the bonding pad 140 at the time of bonding, the dummy wirings 150 that are formed immediately below the bonding pad 140 are compressed by the interlayer dielectric layers 110a–110e formed above and below the dummy wirings 150, and may deform.

The dummy wirings 150 may exfoliate from the interlayer dielectric layers 110a–110e, which may cause a bonding exfoliation.

It is an object of the present invention to provide a semiconductor device with a structure having multiple wiring layers including dummy wirings, which provides good yield.

SUMMARY OF THE INVENTION (Semiconductor Device) A semiconductor device in accordance with the present invention includes multiple wiring layers and a bonding pad, and the semiconductor device comprises:

a dummy wiring forming region where dummy wirings are formed; and a dummy wiring prohibiting region where the dummy wirings are not formed, wherein at least the bonding pad and an area immediately below the bonding pad define the dummy wiring prohibiting region.

It is noted that bonding pads are, among metal wiring layers, exposed surfaces in the metal wiring layers, which are exposed through openings formed in a dielectric layer such as a protection film, in order to electrically connect external electrodes of a semiconductor device and internal elements of the semiconductor device.

In accordance with the present invention, at least the bonding pad and an area immediately below the bonding pad are defined as the dummy wiring prohibiting region, such that dummy wirings are not provided immediately below the bonding pad, and therefore the dummy wirings do not exfoliate, and bonding exfoliation does not occur. As a result, devices with good yield can be manufactured.

The following examples are preferred embodiments of the semiconductor device in accordance with the present invention.

The dummy wiring pattern can be defined as an area that is expanded by a specified distance in parallel with the bonding pad from an outer circumference of the bonding pad and an outer circumference of the area immediately below the bonding pads. In this case, the specified distance may preferably be 4–15 $\mu$m.

The semiconductor device may further include a scribe region, wherein the scribe region is the dummy wiring prohibiting region. This structure can prevent short circuits that may be caused by the dummy wirings which are exfoliated in a dicing process.

A dummy wiring forming region identification mark, a package assembly alignment mark, a chip-interior name indication, a reticle accuracy measuring mark, a product identification number indication, a repair alignment mark, and a fuse may be provided in the dummy wiring prohibiting region. According to this structure, when the dummy wiring prohibiting region is provided in the area described above, the marks and indications can be reliably identified.

DETAILED DESCRIPTION OF THE PREFERRED EMBODIMENTS OF THE PRESENT INVENTION

Preferred embodiments of the present invention will be described below with reference to the accompanying drawings.

Figure 1:
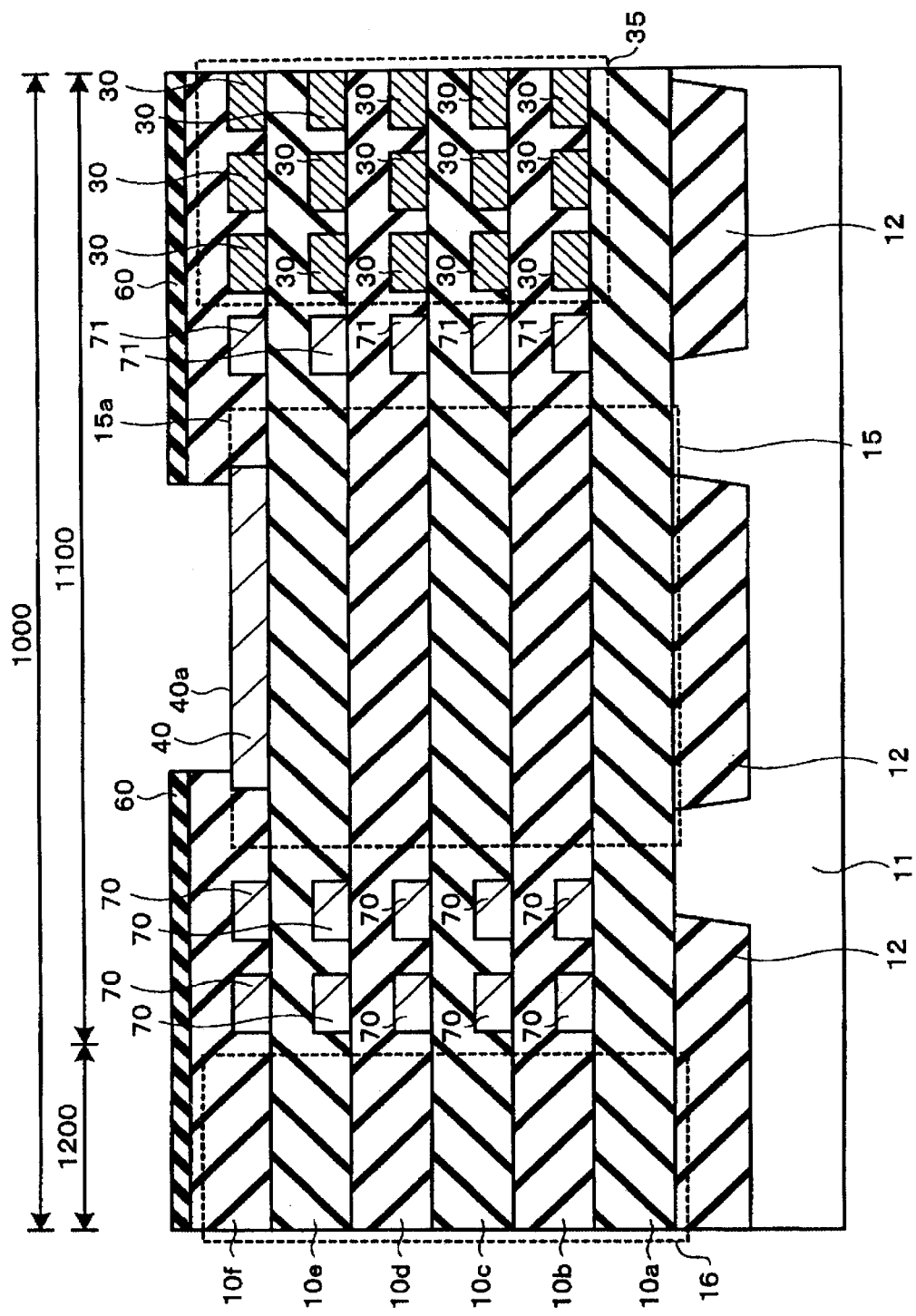
FIG. 1 schematically shows a cross-sectional view of a semiconductor device in accordance with one embodiment of the present invention, and schematically shows a cross section taken along a line A—A indicated in FIG. 2.
Figure 2:
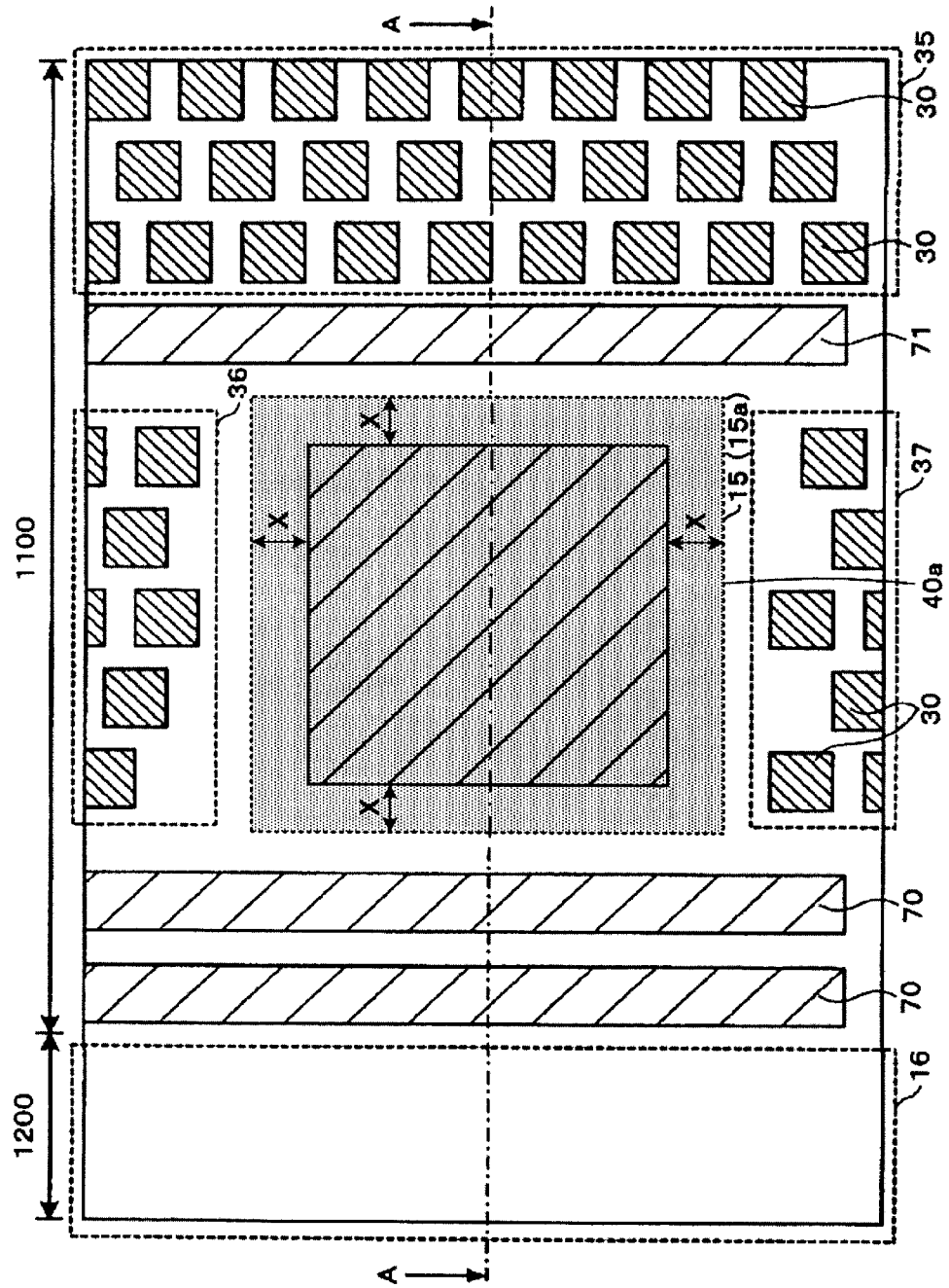
FIG. 2 shows a plan view when the device is cut along a plane that includes a bonding pad 40 and in parallel with a surface of a silicon substrate 11 shown in FIG. 1.
Figure 3:
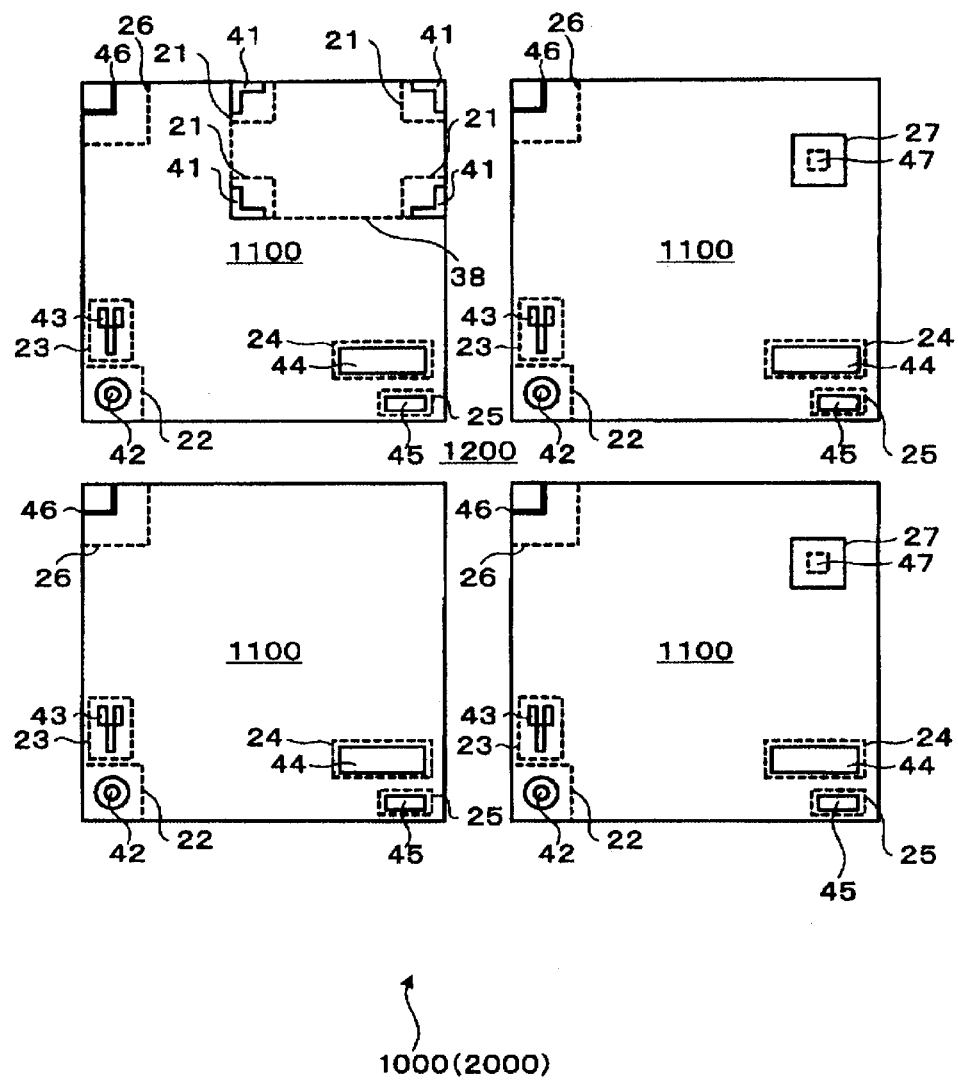
FIG. 3 schematically shows a plan view of a semiconductor wafer that includes the semiconductor device shown in FIG. 1.

FIG. 1 schematically shows a cross-sectional view of a semiconductor device 1000 in one embodiment. FIG. 2 shows a plan view when the device is cut along a plane that includes a bonding pad 40a and in parallel with a surface of a silicon substrate 11 shown in FIG. 1. FIG. 3 schematically shows a plan view of a semiconductor wafer 2000 that includes the semiconductor device 1000 shown in FIG. 1. It is noted that FIG. 1 shows a cross section of the semiconductor device 1000 that is cut along a plane A—A indicated in FIG. 2.

The semiconductor device 1000 has a structure including multiple wiring layers. Before the device 1000 is divided into chips (being diced), the semiconductor device 1000 is formed at least as a part of the semiconductor wafer 2000, as indicated in FIG. 3, and includes an element forming region 1100 and a scribe region 1200. Here, the element forming region 1100 is a region where active elements such as MOS transistors are formed. The scribe region 1200 is a region that is diced by a diamond cutter or the like to divide the semiconductor wafer 2000 into individual chips.

The semiconductor device 1000 is diced along the scribe region 1200 whereby it is divided into individual element forming regions 1100.

In the element forming region 1100, a semiconductor element (for example, a MOSFET (not shown)), wiring layers (not shown) composed of for example polysilicon, and element isolation regions 12 are formed over a surface of the silicon substrate 11. As shown in FIG. 1, first-fifth interlayer dielectric layers 10a–10e and a dielectric layer 10f are successively formed on the silicon substrate 11. The first-fifth interlayer dielectric layers 10a–10e and the dielectric layer 10f are layers composed of, for example, silicon oxide as a main component. A through hole (not shown) is formed in each of the first-fifth interlayer dielectric layers 10a–10e and the dielectric layer 10f, and a contact layer (not shown) is formed in the through hole. Also, the dielectric layer 10f is formed over the uppermost wiring layer (e.g., wiring layers 70 and 71 formed on the fifth interlayer dielectric layer 10e). Furthermore, a passivation layer 60 is formed on the dielectric layer 10f.

The wiring layers 70 and 71 are to be used as actual wirings, and formed on each of the first–fifth interlayer dielectric layers 10a–10e.

The element forming region 1100 includes a dummy wiring forming region 35 that includes dummy wirings 30 and dummy wiring prohibiting regions 15 and 16 in which dummy wirings are not formed, as shown in FIG. 1.

In the dummy wiring forming region 35, the dummy wirings 30 are formed in a layer at the same levels as that of the wiring layers 70 and 71. In other words, the dummy wirings 30 are formed on each of the first-fifth interlayer dielectric layers 10a–10e like the wiring layers 70 and 71. The dummy wirings 30 are formed from the same material as that of the wiring layers 70 and 71, for example they may be formed in the same process that forms the wiring layers 70 and 71.

It is noted that FIG. 2 shows a case in which the dummy wiring 30 has a square cross section. However, the cross-sectional configuration of the dummy wiring 30 is not limited to this shape, and may include any of a variety of shapes such as a rectangle, triangle, trapezoid or any other polygon, circle or oval.

Also, in FIG. 2, patterns of the dummy wirings 30 are arranged in a staggered fashion, but they are not limited to such an arrangement pattern, and a variety of arrangement patterns can also be used.

Also, in the element forming region 1100, a wiring layer 40 that forms a bonding pad 40a is formed on the fifth interlayer dielectric layer 10e. In other words, the bonding pad 40a is formed in a layer at the same level as that of the wiring layers 70 and 71 formed on the fifth interlayer dielectric layer 10e.

The dummy wiring prohibiting region 15 includes a dummy wiring prohibiting region 15a, as indicated in FIG. 2. Here, the dummy wiring prohibiting region 15a is a region that is shaded in FIG. 2. More specifically, the dummy wiring prohibiting region 15a includes the bonding pad 40a and a region extending by a specified distance X from an outer circumference of the bonding pad 40a. Accordingly, dummy wirings are not provided in the region extending by the specified distance X from the outer circumference of the bonding pad 40a in the layer, at the same level as that of the bonding pad 40a.

Further, the dummy wiring prohibiting region 15 also includes a region immediately below the dummy wiring prohibiting region 15a (the shaded region in FIG. 2). Accordingly, dummy wirings are not provided in a region immediately below the dummy wiring prohibiting region 15a. Here, the specified distance X may preferably be, for example, 4–15 µm, although the distance may vary depending on the shape and size of the bonding pad 40a. In the semiconductor device 1000 in accordance with the present embodiment, the dummy wiring prohibiting region 15 is provided in regions immediately below the bonding pad 40a and the region extending by the specified distance X from the outer circumference of the bonding pad 40a, which provides a semiconductor device with good yield. The reasons for this will be described below.

For example, in the semiconductor device 1000 shown in FIG. 1 and FIG. 2, when the specified distance X is 10 µm, the dummy wiring prohibiting region 15a is defined by a region including the bonding pad 40a and the region extending by 10 µm from the outer circumference of the bonding pad 40a. The dummy wiring prohibiting region 15a and a region below the dummy wiring prohibiting region 15a compose the dummy wiring prohibiting region 15. As shown in FIG. 1, dummy wirings are not formed in the dummy wiring prohibiting region 15.

Figure 7:
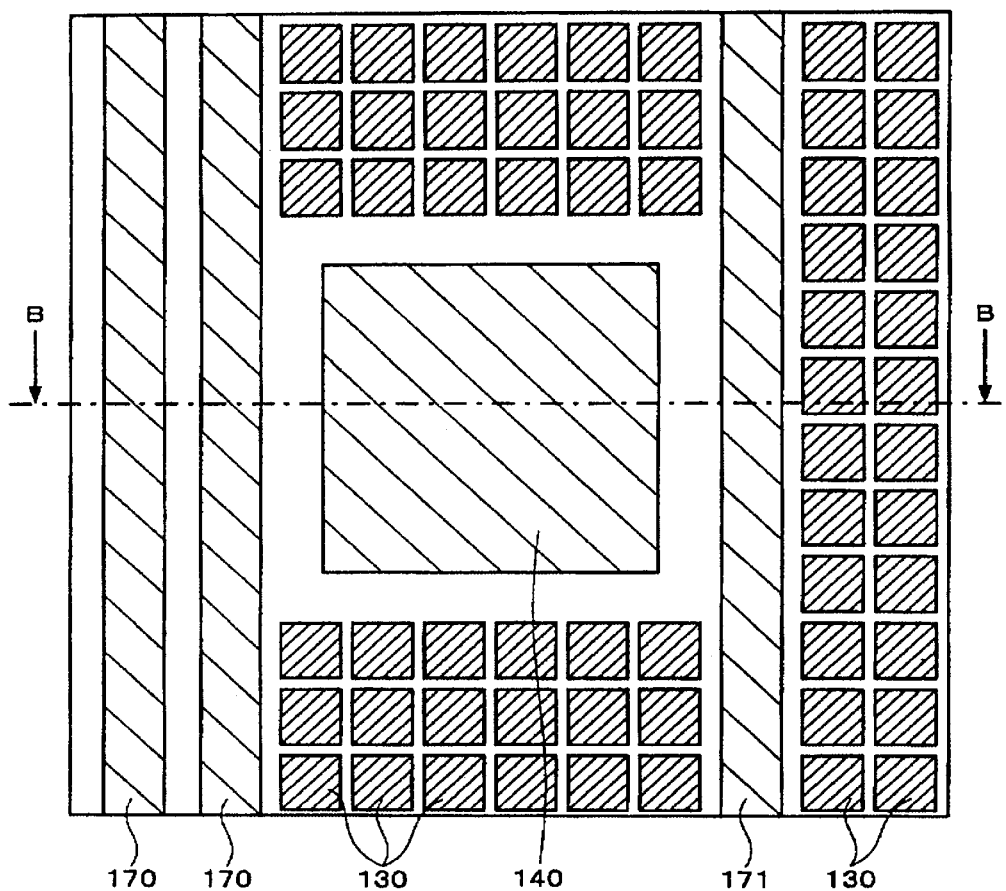
FIG. 7 schematically shows a plan view of a conventional semiconductor device with a structure having multiple wiring layers.
Figure 8:
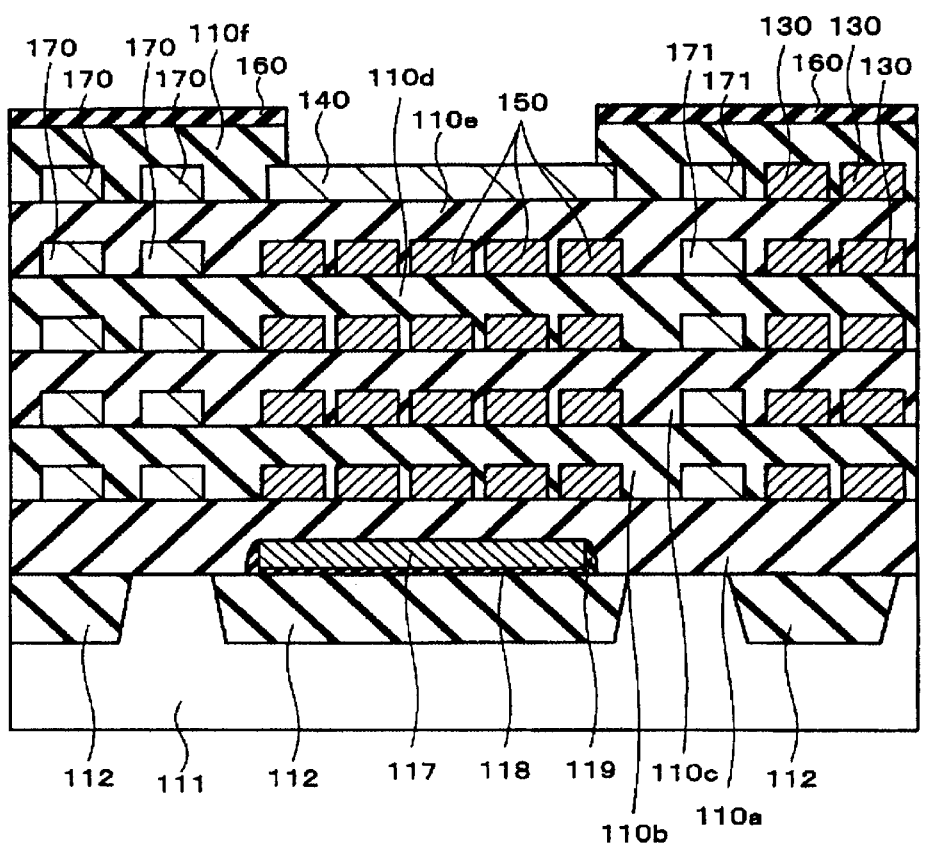
FIG. 8 schematically shows a cross-sectional view of the semiconductor device shown in FIG. 7 taken along a line B—B.

In the semiconductor device 1000 shown in FIG. 1, for example, if dummy wirings were formed immediately below the dummy wiring prohibiting region 15a (the shaded region in FIG. 2), like an ordinary semiconductor device shown in FIGS. 7 and 8, a short circuit may occur in the following manner. When a bump (not shown) is formed on the bonding pad 40a, and then the bump is bonded to an external electrode (not shown), a pressure applied to the bonding pad 40 generates stresses between the dummy wirings formed below the dummy wiring prohibiting region 15a and the dielectric layers 10a–10f formed on and below the dummy wirings, which exfoliate the dummy wirings. Pieces of the exfoliated dummy wirings may adhere, for example, to gaps between the wiring layers 70 thereby causing a short circuit. The exfoliation of the dummy wirings may be caused by, for example, a difference in the hardness of materials that compose the metal layers of the dummy wirings and the dielectric layers. A dielectric layer is normally formed thicker than a metal layer. Furthermore, due to the advanced miniaturization of wirings in recent years, metal layers are formed much more finely. As a result, since the dielectric layers are in many cases harder than the metal layers, it is believed that a pressure that is applied to the bonding pad during a bonding process causes stresses between the dielectric layers and the metal layers, which exfoliates the dummy wirings. For example, when the dummy wirings are composed of Al, the dielectric layers are composed of silicon oxide layers, and the dummy wirings are miniaturized, a pressure applied to the bonding pad during a bonding process causes stresses between the dielectric layers and the dummy wirings because the dielectric layers have a greater hardness than the dummy wirings. It is believed that this results in the exfoliation of the dummy wirings that have a lower hardness.

In contrast, in the semiconductor device 1000 in accordance with the present embodiment, since dummy wirings are not formed below the dummy wiring prohibiting region 15a, dummy wirings would not exfoliate or cause short circuits. As a result, semiconductor devices can be manufactured with good yield. In particular, when a bump electrode formed on the bonding pad 40 is bonded to an external electrode (not shown), problems of exfoliation of the dummy wirings would more likely occur, compared to the case where a wire is used for bonding. The semiconductor device 1000 in accordance with the present embodiment can effectively prevent such exfoliation of the dummy wirings and improve the yield.

Furthermore, in the semiconductor device 1000 shown in FIG. 1, not only dummy wirings but also wiring layers that are formed to be used as actual wirings are not formed in the dummy wiring prohibiting region 15. By this structure, wiring layers would not exfoliate and therefore would not cause short circuits like the dummy wirings 30, and semiconductor devices with good yield can be obtained.

Also, as shown in FIG. 1, a dummy wiring prohibiting region 16 is provided in the scribe region 1200. As described above, the scribe region 1200 is a region that is diced by a diamond cutter or the like to divide the semiconductor wafer including the semiconductor device 100 into individual chips. If dummy wirings were formed in the scribe region 1200, the dummy wirings may exfoliate and result in conductive segments when the semiconductor wafer 2000 is diced along the scribe region 1200, and the conductive segments may adhere between the wiring layers 70 and cause short circuits. In contrast, when the scribe region 1200 is defined as the dummy wiring prohibiting region 16 (or part thereof), occurrence of short circuits due to exfoliation of dummy wirings by a dicing process can be prevented.

Also, in addition to the dummy wiring prohibiting regions 15 and 16, the element forming region 1100 is provided with dummy wiring prohibiting regions 21–27, as shown in FIG. 3. The dummy wiring prohibiting regions 21–27 are provided at least in one layer among the interlayer dielectric layers 10a–10e and the dielectric layer 10f Each of the dummy wiring prohibiting regions 21–27 will be described below.

Figure 4:
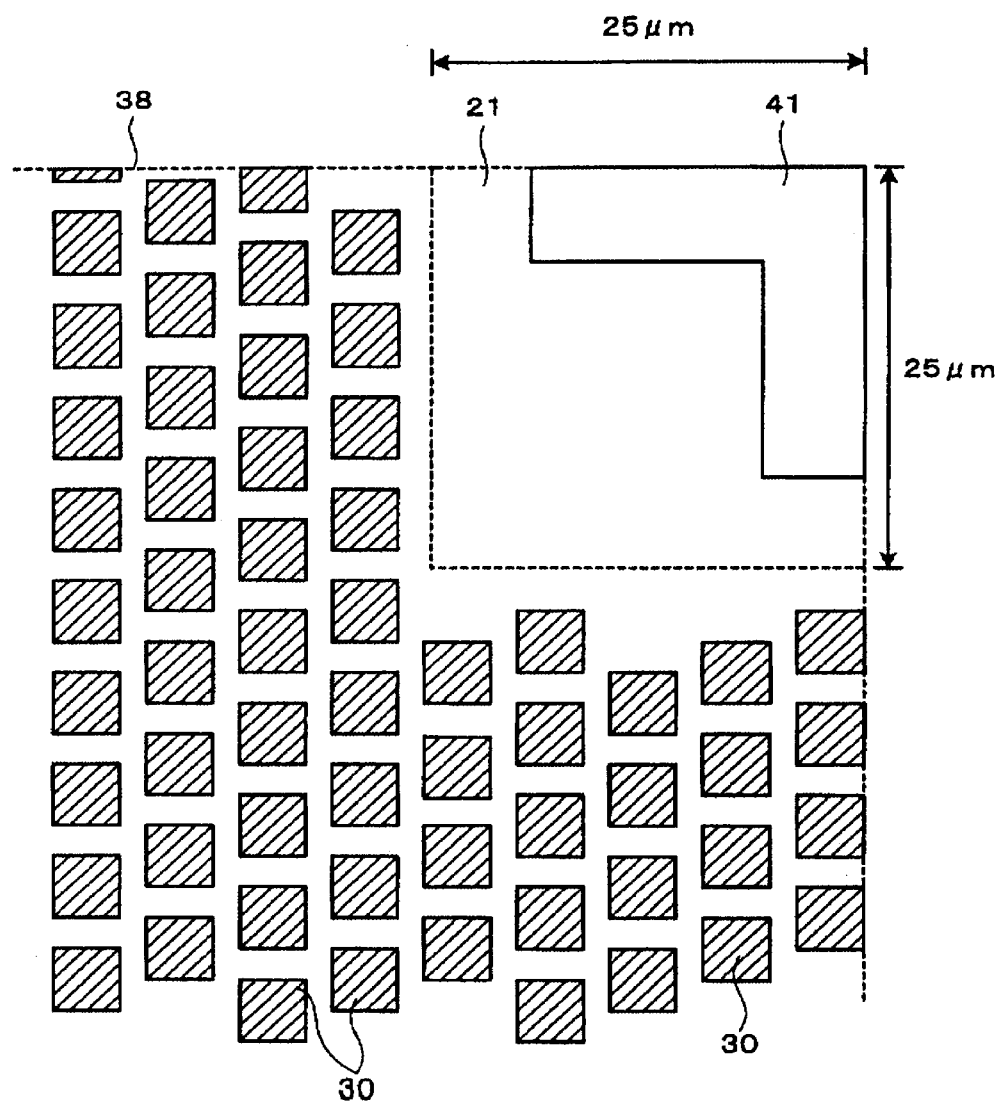
FIG. 4 schematically shows a plan view of one example of dummy wiring prohibiting region provided in the semiconductor device shown in FIG. 3.

The dummy wiring prohibiting region 21 includes an L-letter mark 41, as shown in FIGS. 3 and 4. The L-letter mark 41 is used, when a reticle is used, to measure data insertion accuracy and to confirm a main data region at the time of a reticle examination. Also, as indicated in FIG. 3, a region surrounded by four L-letter marks 41 may be defined as a dummy wiring forming region 38. Such region is formed to identify the dummy wiring forming region 38, and four dummy wiring forming region identification marks 41 form one unit. In other words, as shown in FIG. 3, a region that is surrounded by the four L-letter shaped dummy wiring forming identification marks 41 define the dummy wiring forming region 38. As shown in FIG. 4, dummy wirings 30 are formed in the dummy wiring forming region 38.

The dummy wiring prohibiting region 21 is provided to reliably identify the dummy wiring forming identification mark 41. The dummy wiring prohibiting region 21 is provided in a region where the dummy wiring forming identification mark 41 is formed, and in a region that surrounds the dummy wiring forming identification mark 41. Dummy wirings are not formed in the dummy wiring prohibiting region 21. For example, as shown in FIG. 4, the dummy wiring prohibiting region 21 is provided in a 25 μm squire region that includes the dummy wiring forming identification mark 41, as shown in FIG. 4.

Figure 5:
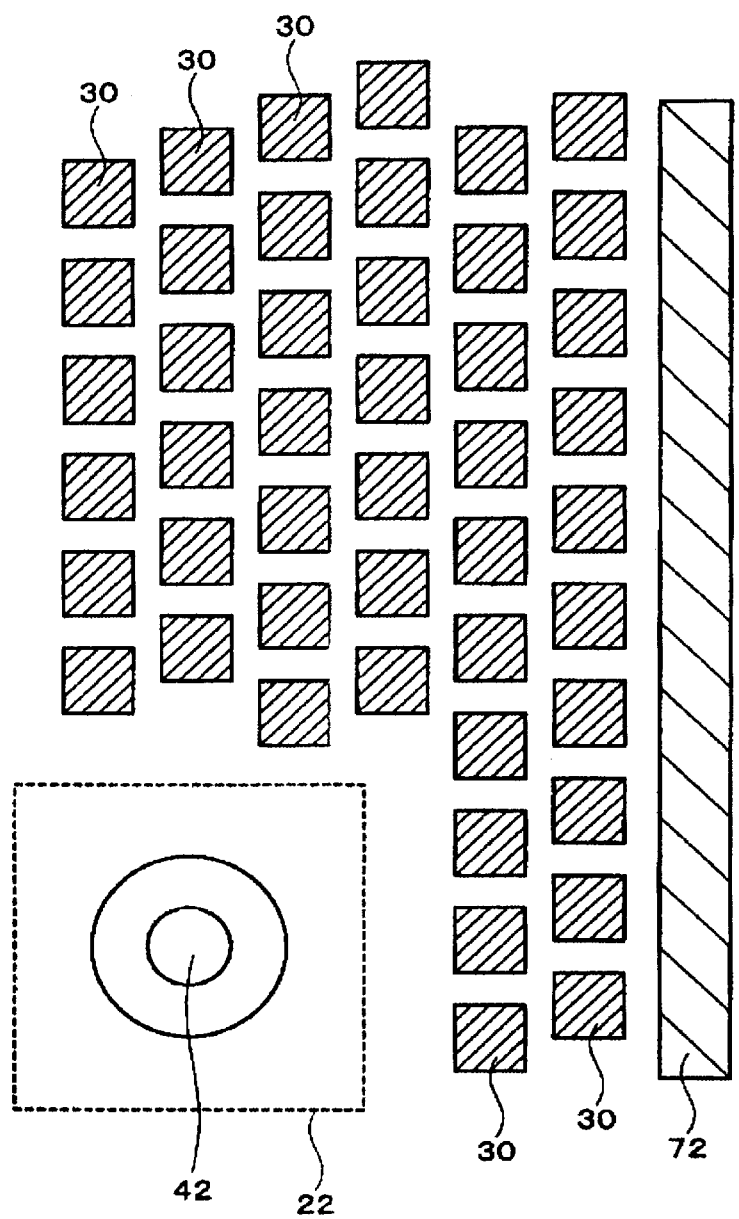
FIG. 5 schematically shows a plan view of one example of dummy wiring prohibiting region provided in the semiconductor device shown in FIG. 3.

The dummy wiring prohibiting region 22 includes an alignment mark 42 with concentric circles for package assembly, as shown in FIGS. 3 and 5. The package assembly alignment mark 42 is used as a positioning marking to position a chip and a substrate for mounting the chip in a package assembly process. The dummy wiring prohibiting region 22 is provided in a region where the package assembly alignment mark 42 is formed and in a region within at least 50 μm from an outer circumference of the package assembly alignment mark 42. For example, as shown in FIG. 5, a 25 μm square region including the package assembly alignment mark 42 is defined as the dummy wiring prohibiting region 22. Since dummy wirings are not formed within the dummy wiring prohibiting region 22, the package assembly alignment mark 42 can be reliably identified. It is noted that the plane configuration of the package assembly alignment mark 42 is not limited to concentric circles, but can be any shape with which the package assembly alignment mark 42 can function as a marking for positioning. Also, FIG. 3 and FIG. 5 show an example in which the plane configuration of the dummy wiring prohibiting region 22 is rectangular, but the plane configuration of the dummy wiring prohibiting region 22 is not limited to such a configuration.

The dummy wiring prohibiting region 23 includes a Y-letter shaped reticle accuracy measuring mark 43, as shown in FIG. 3. The reticle accuracy measuring mark 43 is used to measure the accuracy of a reticle. More specifically, after the reticle is formed, the reticle accuracy measuring mark 43 is used to confirm the measurements of the reticle. The dummy wiring prohibiting region 23 is formed in a region where the reticle accuracy measuring mark 43 is formed, and in a region within at least 10 μm from an outer circumference of the reticle accuracy measuring mark 43. For example, a rectangular region (not shown) that contains the reticle accuracy measuring mark 43 and a region that is within 10 μm from an outer circumference of the rectangular region containing the reticle accuracy measuring mark 43 are defined as the dummy wiring prohibiting region 23. Since dummy wirings are not formed within the dummy wiring prohibiting region 23, the reticle accuracy measuring mark 43 can be reliably identified. It is noted that the plane configuration of the reticle accuracy measuring mark 43 is not limited to a Y-letter shape, but can be any shape with which the reticle accuracy measuring mark 43 can function as a marking for measuring the accuracy. Also, FIG. 3 shows an example in which the plane configuration of the dummy wiring prohibiting region 23 is rectangular, but the plane configuration of the dummy wiring prohibiting region 23 is not limited to such a configuration.

Figure 6:
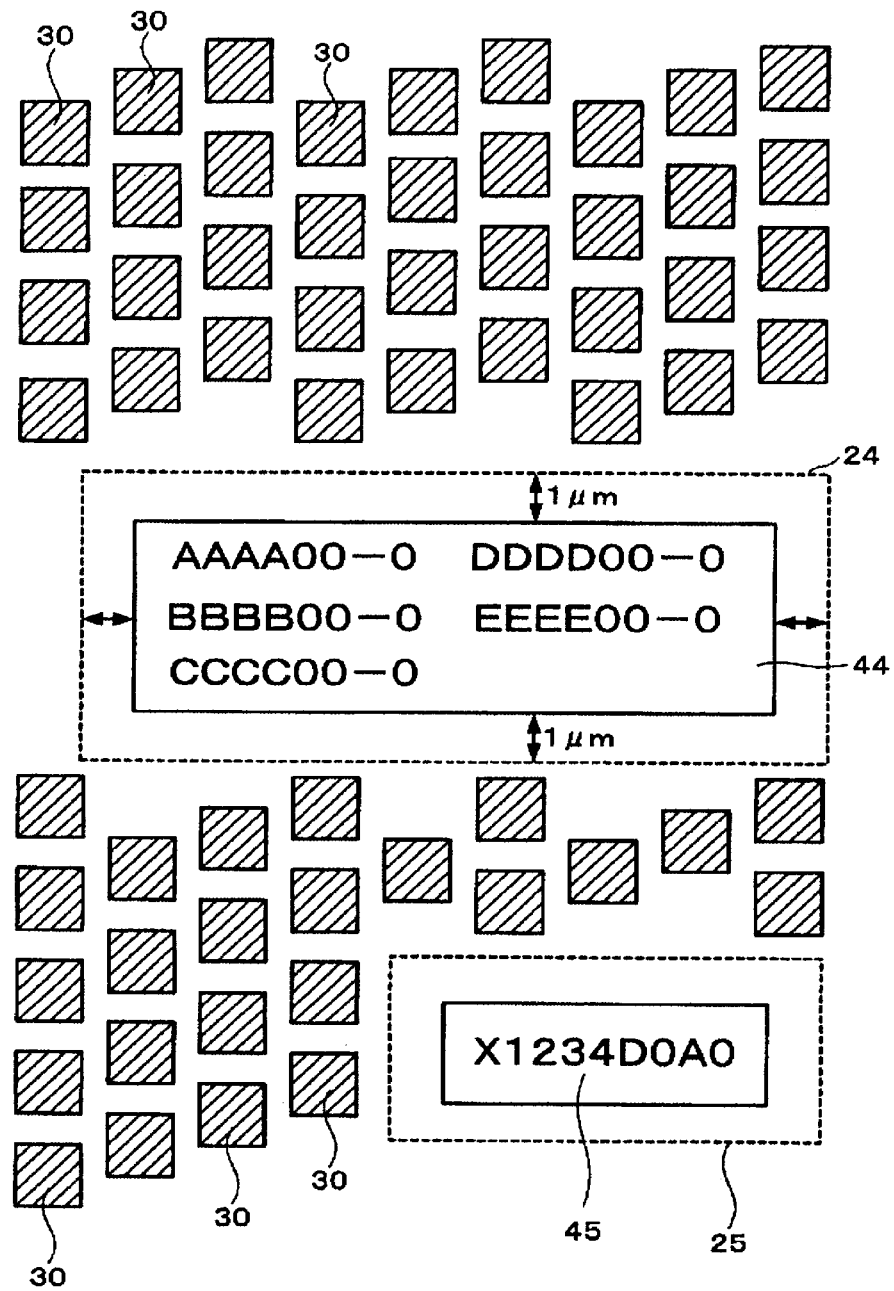
FIG. 6 schematically shows a plan view of one example of dummy wiring prohibiting region provided in the semiconductor device shown in FIG. 3.

The dummy wiring prohibiting region 24 includes a chip interior name indication region 44. The chip interior name includes names representative of the type of a chip, kinds of wiring layers formed within the chip and the like, and the chip interior name indication region 44 is a region that contains character patterns that represent the chip interior name. In other words, the chip interior name indication region 44 is a region that contains entire character patterns formed in plurality. For example, as shown in FIG. 6, the dummy wiring prohibiting region 24 is provided within the chip interior name indication region 44 and in a region within 1 $\mu$m from an outer circumference of the chip interior name indication region 44. Since dummy wirings are not formed within the dummy wiring prohibiting region 24, the chip interior name indication region 44 can be reliably identified. FIGS. 3 and 6 show an example in which the plane configuration of the dummy wiring prohibiting region 24 is rectangular, but the plane configuration of the dummy wiring prohibiting region 24 is not limited to such a configuration.

The dummy wiring prohibiting region 25 includes a product identification number indication region 45, as shown in FIGS. 3 and 6. The product identification number indication refers to a pattern that indicates a product identification number (ID) added within the chip, and the product identification number indication region 45 includes at least a region in which the pattern is formed. For example, as shown in FIG. 6, the dummy wiring prohibiting region 25 is provided in the product identification number indication region 45 and in a region within 1 $\mu$m from an outer circumference of the product identification number indication region 45. Since dummy wirings are not formed within the dummy wiring prohibiting region 25, the product identification number indication region 45 can be reliably identified. FIGS. 3 and 6 show an example in which the plane configuration of the dummy wiring prohibiting region 25 is rectangular, but the plane configuration of the dummy wiring prohibiting region 25 is not limited to such a configuration.

The dummy wiring prohibiting region 26 includes an L-letter shaped repair alignment mark 46. The repair alignment mark 46 is disposed on every chip and is used as an alignment reference mark for chip alignment at the time of repairing. For example, the dummy wiring prohibiting region 26 is provided in a 110 $\mu$m squire region that includes the repair alignment mark 46. Since dummy wirings are not formed within the dummy wiring prohibiting region 26, the repair alignment mark 46 can be reliably identified. It is noted that the plane configuration of the repair alignment mark 46 is not limited to an L-letter shape, but can be any shape with which it can function as a marking for position alignment. Also, FIG. 3 shows an example in which the plane configuration of the dummy wiring prohibiting region 26 is rectangular, but the plane configuration of the dummy wiring prohibiting region 26 is not limited to such a configuration.

The dummy wiring prohibiting region 27 includes a fuse 47, as shown in FIG. 3. For example, the dummy wiring prohibiting region 27 is provided in a region where the fuse 47 is formed, and in a region covering 5 $\mu$m outside an outer circumference of the fuse 47. Since dummy wirings are not formed in the dummy wiring prohibiting region 27, the fuse has an improved fusing property, causes no scattering of dummy wiring when fused, and can be stably processed.

It is noted that FIG. 3 shows an example in which the plane configuration of the dummy wiring prohibiting region 27 is rectangular, but the plane configuration of the dummy wiring prohibiting region 27 is not limited to such a configuration.

Also, the dummy wiring forming identification mark 41, package assembly alignment mark 42, reticle accuracy measuring mark 43, chip interior name indication region 44, product identification number indication region 45, repair alignment mark 46, and fuse 47 contained in the respective dummy wiring prohibiting regions 21–27 are formed at the same level as that of one of the wiring layers including the wiring layers 70 and 71 formed on the respective first-fifth interlayer dielectric layers 10a–10e. The dummy wiring prohibiting regions 21–27 prohibit placement of dummy wirings at all levels of the first-fifth wiring layers 70 and 71.

The entire disclosure of Japanese Patent Application No. 2001-233745 filed Aug. 1, 2001 is incorporated by reference herein.

What is claimed is:

1. A semiconductor device including multiple wiring layers and a bonding pad, the semiconductor device comprising:

a dummy wiring forming region where dummy wirings are formed; and a dummy wiring prohibiting region where the dummy wirings are not formed, wherein at least the bonding pad and an area immediately below the bonding pad define the dummy wiring prohibiting region.

2. The semiconductor device according to claim 1, wherein the dummy wiring prohibiting area further comprises an area extending by a specified distance in parallel with the bonding pad from an outer circumference of the bonding pad and an outer circumference of the area immediately below the bonding pad.

3. the semiconductor device according to claim 2, wherein the specified distance further comprises about 4–15 $\mu$m.

4. The semiconductor device according to claim 1, further comprising a scribe region, wherein the dummy wiring prohibiting region includes the scribe region.

5. A semiconductor device according to claim 1, wherein at least one of a dummy wiring forming region identification mark, a package assembly alignment mark, a chip interior name indication, a reticle accuracy measuring mark, a product identification number indication, a repair alignment mark, and a fuse are provided in the dummy wiring prohibiting region.

6. A semiconductor device comprising:

a substrate;

a plurality of active wirings formed in multiple levels above the substrate;

a plurality of dummy wirings formed in the multiple levels above the substrate;

a bonding pad formed in one of the multiple levels proximate at least one of the plurality of wirings;

a pre-selected dummy wiring forming region wherein the plurality of dummy wirings are formed; and a pre-selected dummy wiring prohibiting region wherein the plurality of dummy wirings are not formed, said dummy wiring prohibiting region including the bonding pad and a first area below the bonding pad.

7. The device of claim 6 wherein the dummy wiring prohibiting region further comprises a second area laterally extending from a circumference of the bonding pad by a given distance.

8. The device of claim 7 wherein the dummy wiring prohibiting region further comprises a third area below the second area.

9. The device of claim 6 wherein the dummy wiring prohibiting region further comprises a scribe area of the semiconductor device.

10. A semiconductor device comprising:
   a substrate including multiple chip regions separated by scribe regions along which the substrate is dividable into multiple chips;
   a plurality of active wirings formed in multiple levels above each of the multiple chip regions of the substrate;
   a plurality of dummy wirings formed in the multiple levels above each of the multiple chip regions of the substrate;
   a bonding pad formed in one of the multiple levels above each of the multiple chip regions proximate at least one of the plurality of wirings;
   a pre-selected dummy wiring forming region in each of the multiple chip regions wherein the plurality of dummy wirings are formed; and
   a pre-selected dummy wiring prohibiting region in each of the multiple chip regions wherein the plurality of dummy wirings are not formed, said dummy wiring prohibiting region including the scribe region.

11. The device of claim 10 wherein the dummy wiring prohibiting region in each of the multiple chip regions further comprises the bonding pad and a first area below the bonding pad.

12. The device of claim 11 wherein the dummy wiring prohibiting region in each of the multiple chip regions further comprises a second area laterally extending from a circumference of the bonding pad by a given distance.

13. The device of claim 12 wherein the dummy wiring prohibiting region in each of the multiple chip regions further comprises a third area below the second area.

* * * * *